United States Patent
Leson et al.

(10) Patent No.: US 9,803,273 B2
(45) Date of Patent: Oct. 31, 2017

(54) METHOD OF PRODUCING AN ANTI-WEAR LAYER AND ANTI-WEAR LAYER PRODUCED BY MEANS OF SAID METHOD

(71) Applicants: Fraunhofer-Gesellschaft zur Foerderung der angewandten Forschung e.V., Munich (DE); H-O-T Haerte- und Oberflaechentechnik GmbH & Co. KG, Nuremberg (DE)

(72) Inventors: Andreas Leson, Dresden (DE); Hans-Joachim Scheibe, Dresden (DE); Frank-Peter Bach, Nuremberg (DE)

(73) Assignees: FRAUNHOFER-GESELLSCHAFT ZUR FÖRDERUNG DER ANGEWANDTEN FORSCHUNG E.V., Munich (DE); H-O-T HAERTE- UND OBERFLAECHENTECHNIK GMBH & CO. KG, Nuremberg (DE)

( * ) Notice: Subject to any disclaimer, the term of this patent is extended or adjusted under 35 U.S.C. 154(b) by 86 days.

(21) Appl. No.: 14/787,335

(22) PCT Filed: Apr. 30, 2014

(86) PCT No.: PCT/EP2014/058884
§ 371 (c)(1),
(2) Date: Oct. 27, 2015

(87) PCT Pub. No.: WO2014/177641
PCT Pub. Date: Nov. 6, 2014

(65) Prior Publication Data
US 2016/0153083 A1 Jun. 2, 2016

(30) Foreign Application Priority Data
Apr. 30, 2013 (DE) .................. 10 2013 007 986

(51) Int. Cl.
*C23C 14/34* (2006.01)
*C23C 14/06* (2006.01)
(Continued)

(52) U.S. Cl.
CPC .......... *C23C 14/0605* (2013.01); *C04B 35/52* (2013.01); *C23C 14/0611* (2013.01);
(Continued)

(58) Field of Classification Search
USPC ....... 427/577; 428/408; 277/442; 204/192.1, 204/192.15, 192.16
See application file for complete search history.

(56) References Cited

U.S. PATENT DOCUMENTS

2007/0209934 A1  9/2007  Meyer
2007/0224349 A1  9/2007  Hosenfeldt et al.
(Continued)

FOREIGN PATENT DOCUMENTS

DE   10 2004 041 235 A1   3/2006
DE   10 2006 009 160 A1   8/2007
(Continued)

OTHER PUBLICATIONS

Zhen_Yu et al "Tribological properties of diamond-like carbon films depositied by pulsed laser arc deposition" Chinese PHysics vol. 12 No. 12 (2009) p. 3790-3797.*
(Continued)

*Primary Examiner* — Archene Turner
(74) *Attorney, Agent, or Firm* — Jacobson Holman, PLLC

(57) ABSTRACT

The invention relates to the production of wear-resistant layers which are exposed to friction wear on surfaces of components of internal combustion engines. In the process, wear-resistant layers are formed on the respective surface by electric arc discharge under vacuum conditions. The wear-
(Continued)

resistant layers are formed from at least approximately hydrogen-free tetrahedrally amorphous (ta-C) comprising a mixture of sp2 and sp3 hybridized carbon and have a microhardness of at least 3500 HV and an arithmetical mean roughness value Ra of 0.1 μm without a mechanical, physical and/or chemical surface processing taking place.

11 Claims, 1 Drawing Sheet

(51) Int. Cl.
  *C23C 14/32*   (2006.01)
  *C23C 28/00*   (2006.01)
  *H01J 37/34*   (2006.01)
  *H01J 37/32*   (2006.01)
  *C04B 35/52*   (2006.01)

(52) U.S. Cl.
  CPC ............ *C23C 14/325* (2013.01); *C23C 14/34* (2013.01); *C23C 28/322* (2013.01); *C23C 28/343* (2013.01); *C23C 28/347* (2013.01); *H01J 37/32055* (2013.01); *H01J 37/32339* (2013.01); *H01J 37/34* (2013.01); *H01J 37/3438* (2013.01); *H01J 2237/327* (2013.01); *H01J 2237/3321* (2013.01)

(56) References Cited

U.S. PATENT DOCUMENTS

| | | | | |
|---|---|---|---|---|
| 2009/0118148 A1* | 5/2009 | Martin | ................ | C10M 105/14 508/109 |
| 2010/0129615 A1* | 5/2010 | Chizik | ................ | C23C 14/025 428/189 |
| 2010/0170781 A1* | 7/2010 | Gorokhovsky | ....... | C23C 14/022 204/192.12 |
| 2013/0140776 A1 | 6/2013 | Kennedy | | |
| 2013/0146443 A1* | 6/2013 | Papa | ................ | C23C 14/35 204/192.16 |
| 2014/0093196 A1 | 4/2014 | Schelbe et al. | | |
| 2014/0137967 A1* | 5/2014 | Chen | ................ | C23C 14/0605 204/192.38 |

FOREIGN PATENT DOCUMENTS

| | | |
|---|---|---|
| DE | 10 2011 003 254 A1 | 8/2012 |
| DE | 2011 016 611 A1 | 10/2012 |
| EP | 1 826 810 A2 | 8/2007 |
| JP | 2008 297477 A | 12/2008 |
| WO | WO 2010/020274 A1 | 2/2010 |

OTHER PUBLICATIONS

Witke et al "Depostion of hard amorphous carbon coatings by laser and arc methods" Surface & Coatings Tech 116-119 (199) p. 609-613.*

Witke et al "Comparison of filtered high-current pulsed arch deposition ( HCA) with conventional vacuum arch methods" Surface & coatings Tech 126 (2000) p. 81-88.*

Charrier et al "Carbon films deposited by physical vapour depostion focused-arc evaporation technique" Diamond & Related Materials 3 (1993) p. 41-46.*

H.-J. Scheibe et al., "Laser-induced vacuum (Laser Arc) and its application for deposition of hard amorphous carbon films", Science & Coatings Technology, vol. 74-75, Oct. 1, 1995.

\* cited by examiner

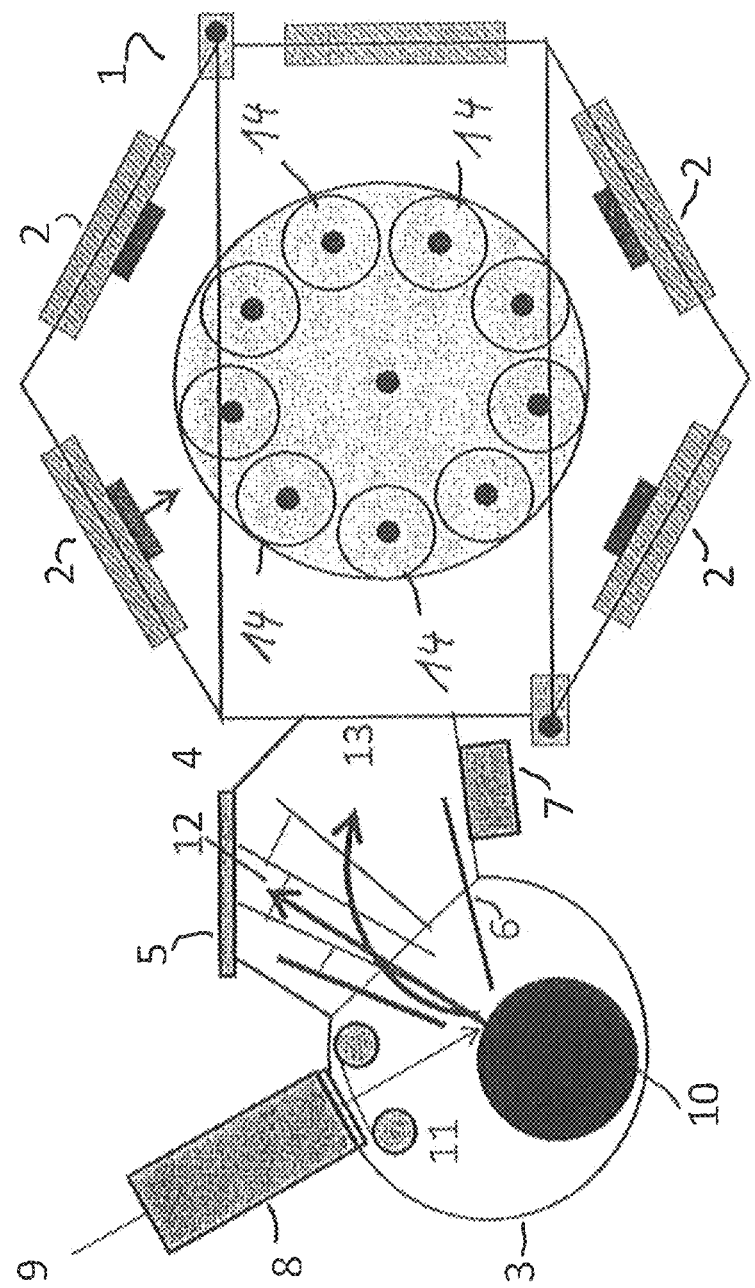

METHOD OF PRODUCING AN ANTI-WEAR LAYER AND ANTI-WEAR LAYER PRODUCED BY MEANS OF SAID METHOD

The invention relates to a method of producing wear-resistant layers which are formed on surfaces of internal combustion engine components which are exposed to frictional wear by means of electrical arc discharge under vacuum conditions on the respective surface and to wear-resistant layers produced using said method. The wear-resistant layers are in this respect formed from hydrogen-free tetrahedral amorphous carbon (ta-C) hybridized from $sp^2$ and $sp^3$. It has been found that this kind of layers in which a maximum hydrogen content of 1 atom %, preferably a maximum of 0.5 atom %, should still be permitted have particularly favorable wear and sliding properties. It has therefore been proposed to use these layers on the most varied surfaces of components of internal combustion engines exposed to wear such as piston rings, bucket tappets, cams of cam shafts or also piston pins.

These layers have a large hardness and therefore an increased wear resistance. The achievable coefficients of friction with a sliding movement acting at the surface of a base body or counter-body not coated in this manner are also small so that this has an advantageous effect on the economic operation and on the $CO_2$ balance.

Such layers can be produced using different PVD vacuum coating processes using a graphite cathode. It has been found in this respect that a particularly high coating rate can be achieved with processes in which electrical arc discharges between an anode or a cathode formed from graphite can be achieved. It is, however, disadvantageous in these processes that larger particles or also so-called droplets are formed during the coating which are deposited in the layer and that the surface properties are thereby disadvantageously influenced so that the surface has to be leveled by a machine finishing. However, this causes substantial problems with layers which have a particularly large hardness and these problems can in particular have a disadvantage with micro-hardnesses above 500 HV since an extremely high time effort is required to be able to obtain sufficiently smooth surfaces of these layers for a favorable sliding behavior.

The so-called laser arc process in which an electrical arc discharge is ignited in the vacuum by means of a pulse-operated laser beam and with which the ionized particle flow can be guided to a substrate by the plasma obtained via the arc discharge and the ionized particles can be deposited thereon as a layer is particularly suitable for forming such hard layers. This kind of layers can, however, also be used in a method known per se in which an electrical arc discharge in the vacuum is utilized for generating the plasma without the arc discharge being initiated by a laser beam. In this respect, the arc discharge can be ignited in a known manner, either solely by a sufficiently high voltage between an anode and a target connected as a cathode, and, on the other hand, there is the possibility of initiating the ignition by means of electrically conductive ignition elements as a result of a short-circuit.

However, these known processes have the disadvantage that their plasma is relatively rich in droplets and particles. To combat this disadvantage, possibilities have, however, been proposed to carry out a so-called "filtering" of the plasma for storing particles. Several possibilities for this are described by B. F. Coll and D. M. Sanders in "Design of Vacuum Arc-Basis Sources"; Surface and Coatings Technology", No. 81 (1996) 42-51. In this respect, it is assumed in these known solutions that when using magnetic fields, the ionized light components of a plasma can be deflected and the substantially larger particles, which can be deflected with more difficulty due to their unfavorable charge/mass ratio, can be separated from one another. These filter arrangements have some substantial disadvantages, however.

The design of these systems is very complex and correspondingly expensive. The diameter of the magnetic filters and thus the diameter of the coating surface is restricted to approximately 150 mm due to the required powerful magnetic fields and the electric powers required for this. The coating rate is reduced to approximately 15-20% in comparison with that without the use of the magnetic filter.

The use of an absorber electrode and of magnets is proposed in DE 10 2006 009 160 A1 for processes in which electrical arc discharges are used for the coating in order to separate larger particles from a plasma and thus to prevent them from being deposited in the coating and thereby also from disadvantageously. influencing the surface geometry.

However, no layers are yet known which are formed from hydrogen-free tetrahedral amorphous carbon (ta-C) hybridized from $sp^2$ and $sp^3$ which at the same time have an increased hardness and in this respect have very good sliding friction properties and in this respect have been deposited on component surfaces at an increased coating rate by means of electrical arc discharges without a subsequent surface processing having to be carried out which results in the smoothing of bumps and in the reduction of roughness.

It is therefore the object of the invention to provide a wear-resistant coating for surfaces of internal combustion engine components which has an improved wear protection and simultaneously has improved sliding properties, wherein the production can take place with a reduced effort and with an increased coating rate by means of electrical arc discharges.

This object is achieved in accordance with the invention by the features of claim 1. Claim 7 relates to wear-resistant layers produced using the method. Advantageous embodiments and further developments of the invention can be realized using features designated in subordinate claims.

Wear-resistant layers are produced using the method in accordance with the invention on surfaces of internal combustion engine components which are exposed for frictional wear. In this respect, a plasma is formed by means of pulsed laser radiation of sequentially ignited electrical arc discharges under vacuum conditions, wherein the electrical arc discharge is operated between an anode and a cathode composed of graphite. Ionized parts of the plasma are formed as a layer which is formed from at least approximately hydrogen-free tetrahedral amorphous (ta-C) comprising a mixture of $sp^2$ and $sp^3$ hybridized carbon (ta-C in accordance with VDI standard 2840) and are deposited on a surface of at least one component.

Positively charged ions of the plasma are moved in the direction of the at least one component by means of an absorber electrode. In this respect, the same electric voltage is at least approximately applied to the anode and to the absorber electrode. While the electrical arc discharges are being carried out, an electric current flows through the absorber electrode which is at least 1.5 times greater than, preferably at least twice as great as, the electric current which flows through the anode.

No mechanical and/or chemical machine finishing of the coated surface of the at least one component is carried out which leads to a smoothing of the surface. A subsequent smoothing of the surface of the formed wear-resistant layer is in particular not required due to the influencing of the respectively different electric current flowing through the anode and the absorber electrode.

The plasma is advantageously formed within a laser arc chamber and is deflected into a vacuum chamber in which the at least one component is arranged. The laser arc chamber can in this respect be flanged to the vacuum chamber. A vacuum is likewise maintained in the laser arc chamber.

Positively charged ions of the plasma should be deflected by means of the absorber electrode such that they do not impact the surface of the at least one component in a direct way coming from the cathode and such that electrons move out of the plasma in the direction of the absorber electrode so that they do not move in the direction of the component surface to be coated or only do so in a small number.

A thin adhesive layer can be deposited on the at least one component using at least one arranged arc discharge source or sputter source which is arranged in the vacuum chamber.

An absorber electrode having a plurality of strips can advantageously be used. Larger drops or droplets can be led off between the strips so that they do not impact the surface of the at least one component. A reflection bringing about the direction of movement of droplets can thus be very largely avoided.

The wear-resistant layer produced in accordance with the invention is formed on surfaces of components of internal combustion engines which are exposed to frictional wear. The have been formed on the respective surface using electrical arc discharge under vacuum conditions and are formed from at least approximately hydrogen-free tetrahedrally amorphous (ta-C) comprising a mixture of $sp^2$ and $sp^3$ hybridized carbon. They can preferably be formed using the already addressed laser arc process.

The wear-resistant layer has a microhardness of at least 3500 HV and an arithmetic mean roughness value $R_a$ of 0.1 μm. In this respect, no subsequent mechanical, physical and/or chemical surface processing is necessary to be able to maintain these roughness values.

The wear-resistant layer produced in accordance with the invention can in this respect advantageously also have an averaged roughness depth $R_z$ of a maximum of 1.0 μm. The averaged roughness depth $R_z$ corresponds to the arithmetical mean value of the individual roughness depths of all measured values.

The wear-resistant layer produced in accordance with the invention should have a reduced peak height $R_{pk}$ of a maximum of 0.35 μm, preferably of a maximum of 0.25 μm. This value is in particular important and therefore advantageous under the aspect of a reduced sliding friction.

Both the arithmetical mean roughness value $R_a$ and the other two roughness values $R_z$ and $R_{pk}$ can be determined using the known stylus process. In this respect, a stylus is used which preferably comprises diamond and has a small tip radius.

It is particularly favorable when the wear-resistant layer has a microhardness of at least 3500 HV, preferably of 4000 HV, further preferably of at least 5000 HV, particularly preferably of at least 5700 HV and very particularly preferably of 6000 HV, and preferably has a mean roughness value $R_a$ less than 0.08 μm, particularly preferably less than 0.05 μm, whereby the wear resistance and the service life can be further improved and increased. An instrument "FISCHERSCOPE H100C XYP" of the company Helmut Fischer GmbH & Co.KG can be used for the hardness measurement. The test force should be selected such that the penetration depth of the indenter amounts to a maximum of 1/10 of the layer thickness.

In a tribological system comprising the counter-body of connecting rod with bushing (brass) and piston of aluminum, a frictional value of less than 0.03, preferably of less than 0.025, can be achieved with a wear-resistant layer produced on piston pins produced in accordance with the invention using an oscillation friction wear tribometer with piston pin module of the company Optimol Instruments Prüftechnik GmbH. This also applies to oil-lubricated trials in a temperature range between 100° C. and 130° C. such as is typical for components of internal combustion engines. The frictional value only changes slightly over the service life of a coated component, wherein a reduction of the frictional value was able to be recognized after a brief running-in period.

The wear rate can be reduced by the factor of 3 with respect to conventional DLC layers.

In this respect, the proportion of $sp^3$ hybridized carbon should lie well above 40%, preferably above 50%.

Furthermore no further chemical elements such as metals or halogens or phosphor should be contained in the wear-resistant layer. This also applies to chemical compounds. For this purpose, optionally only an inert gas such as in particular argon and no hydrocarbon compound should be contained in the laser arc chamber and in the vacuum chamber.

The layer thicknesses should be at least 0.5 μm, preferably 2 μm or more,

At least one adhesive layer and/or intermediate layer can advantageously have been formed on the surface to be coated on which then a wear-resistant layer in accordance with the invention is formed. A chromium layer having a layer thickness of at least 0.1 μm can be selected for this purpose, for example.

A cylindrical cathode (target) of graphite can advantageously be used in the production which rotates about its longitudinal axis during the process so that the respective arc discharge bottoms of the electrical arc discharges extend over the total surface of the cathode and a uniform removal of the carbon can thereby be achieved. On ignition of pulse-operated electrical arc discharges using a laser beam, the laser beam can likewise be correspondingly pulse-operated and deflected such that it impacts the surface of the cathode at different predefined positions and an electrical arc discharge can be ignited there on each laser pulse as a result of the energy input. The electric voltage between an anode and the cathode is controlled in this respect such that the arc is extinguished again after a respective predefined time in order subsequently to ignite a further arc discharge at another position. The layer thickness of a wear-resistant layer to be formed can be influenced by means of the number of the electrical arc discharges used with a known size of a surface to be coated. Other process parameters should then be kept as constant as possible, however.

Influence can likewise be taken on the layer to be formed using the parameters electric current and electric voltage at which electrical arc discharges are operated, their duration, their pulse frequency and a bias voltage applied to a component (substrate) to be coated during the arc pulse. This in particular applies to the layer design and in particular to the portions of $sp^2$ and $sp^3$ hybridized carbon.

Electric currents above 1000 A, preferably above 1500 A, can thus be used and a pulse frequency can be selected between 300 Hz and 600 Hz. A bias voltage in the range −50 V to −200 V, preferably in the range 100 V, can be applied to the component to be coated. An electric current of 500 A±100 A (preferably ±50 A) can thus flow through the anode and of 1100 A±100 A (preferably ±A) through the absorber electrode when electrical arc discharges have been ignited and operated. The operation of electrical arc discharges can take place at a pulse duration in the range 250 µs to 600 µs. A termination of the electrical arc discharges can be achieved by reducing the electric voltage, at least at the anode. An ignition of electrical arc discharges after a pulse-performed irradiation of the surface of the cathode by a laser beam directed onto the surface can take place at an increased electric voltage which is reduced after igniting the respective electrical arc discharge.

An apparatus should be used in the coating with which larger particles can be prevented from impacting the surface to be coated. This can be an absorber electrode, alone in each case.

In this respect, a design can be used such as is known from DE 10 2006 009 160 A1 and its disclosure content is here referenced in full. In this case, at least one permanent magnet element is used which is aligned in parallel with the axis of rotation of the cathode or in parallel with the surface of a cathode. In addition, in this respect, an absorber electrode is present by which an electric field is formed and through which the plasma is guided which is formed by means of the electrical arc discharge. The movement, in particular the direction of movement, of larger particles contained in the plasma can be influenced both by the permanent magnet element(s) and by the absorber electrode such that they do not impact the surface to be coated or do not impact it at an angle which avoids an integration into the layer. In addition, at least one diaphragm can be arranged between the surface of a component to be coated and the cathode through which the plasma containing the carbon ions which can be used for the layer formation is guided in the direction of the surface to be coated. The absorber electrode can in this respect be arranged in the direction of movement of the plasma after a diaphragm and/or anode. A permanent magnet element can, for example, be arranged in the shadow of a diaphragm or of a diaphragm element.

The invention will be explained in more detail by way of example in the following.

There is shown:

FIG. 1 in schematic form, the design of an apparatus which is suitable for forming wear-resistant layers in accordance with the invention.

FIG. 1 shows a vacuum coating plant having a vacuum chamber 1 in which a rotary apparatus in which components 14 to be coated can be fixed and thus coated both at twice and at three times the rotation. Known arc discharge sources or sputter sources 2 or a combination of both are present in the vacuum chamber 1 for plasma etching or for depositing a thin adhesive layer.

A laser arc chamber 3 having a rotating graphite roller as a cathode 10 and having a foil cover 11 for protecting the laser entry window from vaporization is flanged to the vacuum chamber 1. A filter module 4 is present in the direction of the vacuum chamber 1 and has a service door and an internal design of the absorber anode arrangement 5, 6 and a laterally attached permanent magnet arrangement 7.

Furthermore, a scanner and focusing system 8 is present at the laser arc chamber 3 and has a laser entry window for the linear guiding of the laser beam 9 over the full cathode length. The path of the larger particles selected from the plasma generated by means of electrical arc discharge between the cathode 10 and the anode 6 in the direction of the absorber electrode 5 is illustrated by an arrow with the reference numeral 12. The electrical arc discharges are ignited by means of the deflectable laser beam 9 on the surface of the cathode 10 which comprises 99.9% graphite. In this respect, the cathode 10 rotates about an axis of rotation which is aligned perpendicular to the plane of the drawing and the laser beam 9 is deflected along this axis of rotation. A uniform removal of cathode material can be utilized and simultaneously a large region for coating in the vacuum chamber 1.

The absorber electrode 5 is connected to an electrically positive potential. It is formed by a plurality of electrically conductive strip-shaped elements which are arranged at an interval from one another. Gaps are formed between the strip-shaped elements and larger particles can be guided through them.

Reference numeral 13 illustrates the path of the deflected carbon ions of the plasma to the rotary apparatus with the components 14 to be coated by an arrow.

Coating should preferably take place at threefold rotation on the formation of the wear-resistant layers on the surfaces of the components 14. After evacuating the vacuum chamber 1 and carrying out the surface cleaning and surface activation, a Cr adhesive layer having a thickness of approximately 0.1 µm is deposited by means of sputtering.

The deposition of the ta-C layer with a thickness of approximately 1 µm subsequently takes place. Due to the selected parameters of the pulsed laser arc source: electric arc current 1600 A, pulse length 350 µs at a frequency of 520 Hz in combination with the bias parameters adapted to the laser arc source in a high-voltage range of −800 V at a pulse length of 350 µs and a low-voltage range of −100 V at a pulse length of 200 µs, very hard and smooth ta-C layers having a great adhesion to the component surface (Rc 1) are deposited. A division of the electric current takes pace, where 1100 A flows through the absorber electrode 5 and 500 A flows through the anode 6. The anode 6 is arranged closer to the cathode 10 than the foot of the absorber electrode 5 facing in the direction of the cathode 10.

The roughness values determined by means of a profilometer amount to: $R_a$ on average 0.09 µm, $R_z$ on average 1.0 µm and $R_{pk}$ on average 0.28 µm. The microhardness of the wear-resistant layer determined using a fischerscope amounts to 7040 HV and Young's modulus determined using a Lawave

We claim:

1. A method of producing wear-resistant layers on surfaces of components of internal combustion engines which are exposed to frictional wear, wherein a plasma is formed by means of pulse-operated laser radiation from sequentially ignited electrical arc discharges under vacuum conditions, wherein the electrical arc discharge is operated between an anode (6) and a cathode (10) of graphite and ionized parts of the plasma are deposited on a surface of at least one component (14) as a layer which is formed from at least approximately hydrogen-free tetrahedrally amorphous (ta-C) comprising a mixture of sp2 and sp3 hybridized carbon,
wherein the method further comprises deflecting the plasma by an absorber electrode (5) such that positively charged ions of the plasma are deflected in the direction of the at least one component (14) by applying at least approximately the same electric voltage at the anode (6) and at the absorber electrode (5) as the electrical arc discharges and providing an electric current flow through the absorber electrode (5) which is at least 1.5 times greater than the electric current flow through the anode (6), and
wherein said coated surface of the at least one component (14) is free of any mechanical and/or chemical machine finishing.

2. A method in accordance with claim 1, characterized in that the electric current flowing through the absorber electrode (5) is at least two times greater than the electric current which flows through the anode (6).

3. A method in accordance with claim 1, characterized in that the plasma is formed within a laser arc chamber (3) and is deflected into a vacuum chamber (1) in which the at least one component (14) is arranged.

4. A method in accordance with claim 1, characterized in that positively charged ions of the plasma are deflected by means of the absorber electrode (5) such that they do not impact the surface of the at least one component (14) in a direct way starting from the cathode (10) and electrons move from the plasma in the direction of the absorber electrode (5).

5. A method in accordance with claim 1, characterized in that a thin adhesive layer is deposited on the at least one component (14) using arc discharge source(s) or sputter source(s) (2) arranged in the vacuum chamber (1).

6. A method in accordance with claim 1, characterized in that an absorber electrode (5) is used having a plurality of strips between which larger drops or droplets are led off so that they do not impact on the surface of the at least one component (14).

7. A method in accordance with claim 1, characterized in that the wear-resistant layer has a microhardness of at least 3500 HV and an arithmetical mean roughness value Ra of 0.1 μm without a mechanical, physical and/or chemical surface processing having taken place.

8. A method as claimed in claim 7, wherein the wear-resistant layer has a microhardness of at least 4000 HV.

9. A method as claimed in claim 7, wherein the wear-resistant layer has a mean roughness depth Rz of a maximum of 1.0 μm.

10. A method as claimed in claim 7, wherein the wear-resistant layer has a reduced peak height Rpk of a maximum of 0.35 μm.

11. A method as claimed in claim 7, wherein the wear-resistant layer has a microhardness of at least 5000 HV.

* * * * *